United States Patent [19]

Jones et al.

[11] Patent Number: 4,877,175
[45] Date of Patent: Oct. 31, 1989

[54] LASER DEBRIDGING OF MICROELECTRONIC SOLDER JOINTS

[75] Inventors: Marshall G. Jones, Scotia, N.Y.; Prem N. Batra, Cincinnati, Ohio

[73] Assignee: General Electric Company, Schenectady, N.Y.

[21] Appl. No.: 292,048

[22] Filed: Dec. 30, 1988

[51] Int. Cl.$^4$ ............... B23K 26/00; B23K 26/04; B23K 26/06

[52] U.S. Cl. ............... 228/102; 228/105; 228/163; 228/264; 228/9; 228/19; 219/121.65; 219/121.66; 219/121.82; 219/121.83

[58] Field of Search ............... 228/180.2, 264, 102, 228/105, 159, 163, 201, 9, 19; 219/121.65, 121.66, 121.82, 121.83

[56] References Cited

U.S. PATENT DOCUMENTS 3,717,742  2/1973  Fottler ............... 228/180.2
4,564,736  1/1986  Jones et al. ............... 219/121.6
4,657,169  4/1987  Dostoomian ............... 228/180.2
4,676,586  6/1987  Jones et al. ............... 219/121.6
4,681,396  7/1987  Jones ............... 219/121.6

Primary Examiner—Nicholas P. Godici
Assistant Examiner—Samuel M. Heinrich
Attorney, Agent, or Firm—John S. Beulick; James C. Davis, Jr.; Paul R. Webb, II

[57] ABSTRACT

A solder bridge between leads of a microelectronic circuit is removed by projecting a laser beam onto the solder bridge with sufficient power to cause the solder forming the bridge to melt and to flow onto a wicking tool placed into contact with the solder bridge. The wicking tool is removed during the heating to remove the solder and debridge the leads. Microelectronic leads having a width of the order of 4 mils and a pitch of the order of 8 mils may be debridged easily using the invention.

20 Claims, 1 Drawing Sheet

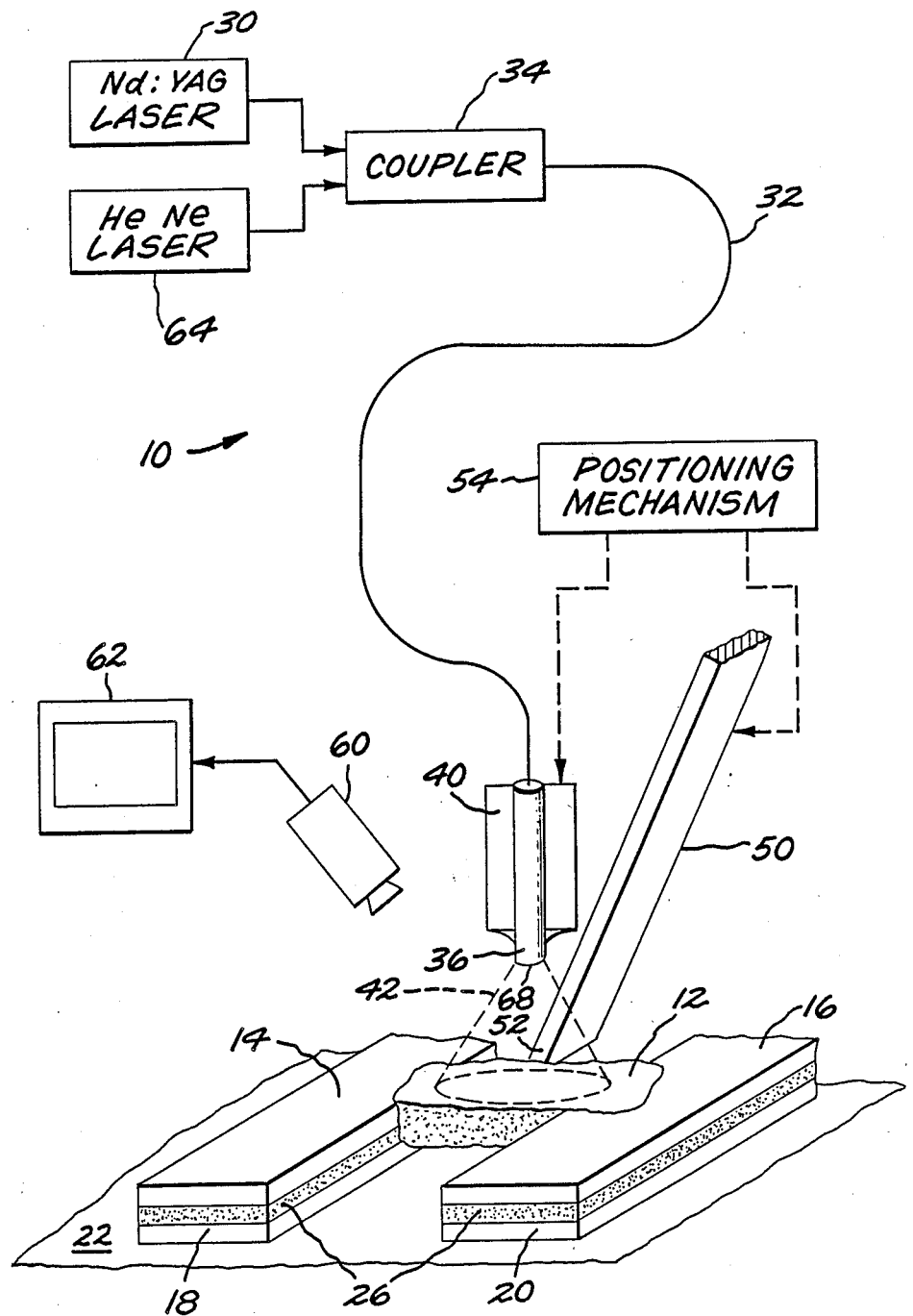

LASER DEBRIDGING OF MICROELECTRONIC SOLDER JOINTS

BACKGROUND OF THE INVENTION

The present invention relates generally to methods and apparatus for debridging solder joints and the like, and more particularly to the debridging of microelectronic solder joints using a laser.

In the microelectronics industry, surface mounted microelectronic circuit devices and the like are typically mounted on a substrate such as a printed wire board by soldering the leads of the devices to pads bonded to the board surface.

The formation of an undesired solder bridge between two or more adjacent soldered leads has been a long-standing problem in the microelectronics industry. Since such bridges represent undesired electrical connections, it is necessary that they be removed. There is an emphasis today on minimizing the physical size of microelectronic circuits and on increasing the physical density of circuits on chips. As the size of the microelectronic circuit leads and the pitch (center-to-center spacing) of the leads becomes smaller, it becomes even more difficult to perform a debridging operation. This is because of the large size of conventional tools relative to the size of the leads and to the fact that the leads generally are quite flexible and easily moved and become particularly acute with leads having a width of the order of 4 mils or less and a pitch of the order of 8 mils or less, which is typical of tape automated bonding (TAB) devices and is similar to other surface mounted devices.

In the past, both conductive and convective heating methods have been used for debridging and, in some cases, in desoldering operations. Conductive methods have included the use of soldering irons to melt the excess solder, which is subsequently removed by a wicking action onto another material or by evacuating the excess solder away from the area. This method may be effective with larger 25 mil pitch leads or greater, but the large physical size of a soldering iron and the inability to confine the area affected by it to the undesired solder bridge makes it very difficult to use a soldering iron with 8 mil pitch leads. Convective heating methods include the use of a hot air jet for melting solder, and such methods are presently being used for desoldering operations. Although it may be possible to perform a debridging operation using an individual hot air jet, it is difficult to control such an air jet and to limit the area which is heated. This makes it difficult to control the amount of solder which is removed, especially at a solder joint, and makes it particularly difficult to use such a process with 8 mil pitch or smaller leads. In order to melt and remove just the solder that constitutes the bridge between 8 mil pitch leads (typically a 4 mil gap) without effecting the soldered leads directly is very difficult when using a hot air jet. Moreover, 8 mil pitch leads are quite flexible and fragile, as noted, making it very easy for a jet of air to lift the lead off of its pad or to damage the lead during debridging. A similar problem exists with respect to a soldering iron which contacts the lead and exerts a force on it.

At present, there is, in some cases, no way to repair microelectronic circuits having such small pitch leads and bridges between solder joints. Where repair is possible, it is usually very difficult and expensive. Therefore, in a production environment, if a microelectronic circuit board is found to have a solder bridge, the absence of a convenient and inexpensive way to repair the board usually results in the board being discarded rather than an attempt being made to repair it.

There is a need for a method and an apparatus for repairing microelectronic circuit boards and the like to remove bridges quickly and easily between solder joints or solder leads without affecting the integrity of the debridged joints or causing damage to the leads. It is to these ends that the present invention is directed.

SUMMARY OF THE INVENTION

The invention satisfies the foregoing objective by providing a method and an apparatus for quickly and easily melting and removing the solder which forms a bridge between leads of a microelectronic circuit or the like without damage to the leads and without affecting the integrity of the debridged joints. The invention advantageously employs a non-contacting heat source which may be controlled precisely and accurately to melt only the solder which forms a bridge between two leads and which imposes no forces of any type on the leads which could cause damage or otherwise affect joint integrity or cause desoldering.

Broadly stated, the invention affords a method of debridging microelectronic solder joints which comprises positioning a tool in contact with a bridge of solder that extends between the soldered leads of a microelectronic circuit; projecting a laser beam onto the solder bridge to heat the bridge; controlling the power in the laser beam to cause melting of the solder and wicking of the solder forming the bridge onto the tool; and removing the tool to remove the solder bridge between the leads.

In another aspect, the invention affords an apparatus for debridging microelectronic solder joints comprising a tool; means for positioning the tool in contact with a bridge of solder that extends between microelectronic leads; means for projecting a laser beam onto the solder bridge so as to cause melting of the solder and wicking of the melted solder onto the tool; and means for removing the tool in order to remove the solder bridge from between the leads.

In accordance with more specific aspects, the laser beam may be transmitted to the solder bridge by an optical fiber, and the output end of the optical fiber may be positioned adjacent to the solder bridge so that the diverging laser beam from the output end of the optical fiber is projected onto the solder bridge. Only a moderate energy density is required of the laser beam, since its purpose is not to vaporize the solder bridge but only to melt the solder so that the solder may flow onto a wicking tool which is placed in contact with the bridge. While the solder is in a liquid state, the tool may be lifted and removed, which removes the bulk of the solder forming the bridge and, accordingly, removes the bridge between the leads. Any solder remaining after the tool is removed will wick onto the leads as a result of surface tension.

The invention may employ two laser beams, a low power laser beam having a wavelength in the visible spectrum used to facilitate positioning of the output end of the optical fiber relative to the area to be heated, and a higher power laser beam for heating and melting the solder which forms a bridge between adjacent leads. The low power laser beam enables the output end of the optical fiber to be positioned easily relative to the solder bridge so that the laser beam projected from the fiber is directed onto and generally confined to the solder bridge. Being in the visible spectrum, the low power beam enables precise determination of the area which will be heated and melted by the higher power laser beam.

Preferably, the invention includes a viewing system such as a camera and CRT or a microscope which produces a magnified image. This facilitates the location of solder bridges and the positioning of the wicking tool and optical fiber. The optical fiber and wicking tool may be positioned manually or by using an automatic positioning system.

Other features and advantages of the invention will become apparent from the description which follows.

BRIEF DESCRIPTION OF THE DRAWING

The single figure is a diagrammatic view which illustrates an apparatus in accordance with the invention for the laser debridging of microelectronic solder joints.

DESCRIPTION OF A PREFERRED EMBODIMENT

The present invention is particularly well suited for removing undesired solder bridges between adjacent solder leads of a microelectronic circuit or the like and will be described in that context. It will become apparent, however, that this is illustrative of only one utility of the invention.

Referring to the drawing, there is illustrated an apparatus 10 in accordance with the invention which is useful for repairing an electrical device comprising a microelectronic circuit or the like (not shown) to remove an undesired solder bridge 12 which extends between a pair of solder joints of the microelectronic circuit. The solder joints may comprise adjacent metal electrical leads 14 and 16 of the microelectronic circuit which are soldered to corresponding metal pads 18 and 20, respectively, of a substrate such as printed wire board 22 or the like which supports the microelectronic circuit. In a known manner, pads 18 and 20 may be bonded to the printed wire board 22, and each lead may be electrically connected to its respective pad by a layer of solder 26 between the lead and the pad.

Solder bridge 12 is generally created during the soldering of the leads to the pads by excess solder flowing between the adjacent leads and hardening upon the solder being cooled. The solder bridge forms an undesired electrical connection between the leads, in effect electrically shorting the two leads together. In most cases, this will cause the microelectronic circuit to malfunction and necessitates repair of the printed wire board by removing the solder bridge in order to render the microelectronic circuit device usable.

The microelectronic circuit device may be a surface mounted device or the like mounted to the printed wire board by a tape automated bonding device or the like. The microelectronic circuit may have a high lead density (number of leads per linear dimension) with leads on an 8 mil (0.2 mm) pitch or less, for example, where pitch refers to the center-to-center spacing of the leads. Specifically, the leads may have width of the order of 4 mils and the gap between the leads may also be of the order of 4 mils. Solder bridge 12 may extend across this 4 mil gap between leads, or between a lead and another component on the board. As may be appreciated, leads of such size are usually quite flexible and somewhat fragile. This necessitates the exercise of care in repairing the board to remove a solder bridge in order to avoid damage to the leads. Furthermore, the small pitch and spacing between the leads complicates repair and renders removal of the solder bridge difficult and time consuming at best, and may even preclude repair.

One of the difficulties in repairing a board to remove a solder bridge between such microelectronic leads is the difficulty in concentrating and confining the heat required to melt the solder bridge to the bridge itself so that desoldering of the leads from their pads does not occur. If any force is exerted on the leads during the debridging process and melting of the solder connecting the leads to their pads occurs, the leads may be lifted off of their pads and moved out of position or otherwise damaged. The invention avoids these problems by providing a non-contacting heat source for melting the solder which forms the bridge without adversely affecting the surrounding area and a tool which enables the melted solder to be removed quickly and easily. The manner in which this is accomplished will not be described.

As shown in the figure, the invention may employ a suitable laser 30, such as a solid state Nd:YAG laser, as a heat source for melting the solder which forms the solder bridge between the leads. A Nd:YAG laser is convenient as a heat source since this type of laser couples well with the solders typically used in joining leads of microelectronic circuits and components, and, for short durations, e.g., less than thirty seconds, the 1.06 micron wavelength of this type of laser does not readily couple with most printed wire board materials. This facilitates confinement of the heat affected area to the solder bridge. Visible and ultraviolet wavelength lasers are possible alternate heat sources.

The laser beam from laser 30 may be coupled to an optical fiber 32 by means of a coupler 34, as shown, for transmission of the laser beam to the solder bridge. Although the laser beam from laser 30 may be delivered to the solder bridge using hard optics (lenses and the like), it is preferable to deliver the laser beam to the solder bridge using an optical fiber since this simplifies control of the laser beam positioning. The output end 36 of the optical fiber may be disposed in a holder 40 to enable the end to be positioned adjacent to solder bridge 12. As the laser beam exits the output end of the optical fiber, the beam diverges as shown by the dotted lines 42 in the figure. The output end of the optical fiber may be positioned relative to the solder bridge, such that the diverging beam is projected onto and substantially confined to the solder bridge.

As will be described in more detail shortly, the laser beam is not used for vaporizing the solder, but only for just melting it so that it will flow. Accordingly, laser 30 need only provide moderate output power, and the diverging laser beam from the output of the optical fiber may be used directly for heating without the necessity of focusing the beam. In fact, it may be preferable not to use a lens system which focuses the laser beam, since this may require that the beam be defocused to reduce the energy density applied to the solder bridge. Because of its small size, the optical fiber may be readily positioned adjacent to the solder bridge so that the diverging laser beam is projected substantially only onto the solder bridge. This avoids heating of leads 14 and 16 and possibly melting of the solder 26 which connects the leads to their pads, and minimizes the possibility of impairing their pads, and minimizes the possibility of impairing the integrity of these connections.

To facilitate removal of the melted solder, a small wicking tool 50 is employed. The tool, which may comprise a small metallic needle or thin blade, as of steel or copper, should have a thin dimension which is less than the spacing or gap between the adjacent leads 14 and 16. Tool 50 should be constructed so that the tip 52 of the tool may be brought into contact with the solder bridge 12 during the debridging process. As will be described shortly, the purpose of tool 50 is to enable the melted solder forming the solder bridge to be wicked, i.e., flow, onto the tool and be removed.

The output end of the optical fiber and the wicking tool may be positioned relative to solder bridge 12 either by hand or by means of a manual or automatic positioning mechanism 54, as indicated in the figure. To facilitate debridging, it is desirable that a viewing system be included for producing an enlarged or magnified image of the area where debridging is to be performed. In the form illustrated in the figure, the viewing system may comprise a video camera 60 and a CRT display 62 for displaying a magnified image of solder bridge 12 and the surrounding area.

In order to facilitate precise location of the laser beam prior to debridging, the apparatus may employ a lower power laser 64 which produces a laser beam having a wavelength in the visible spectrum, such as a HeNe laser. The output beam from laser 64 may be coupled via coupler 34 into the optical fiber 32 and projected onto the leads of the microelectronic circuit to enable precise location of the area which will be heated by the higher power laser 30. This facilitates positioning of the optical fiber.

Optical fiber 32 may comprise a conventional single thin quartz core optical fiber. Input coupler 34 may comprise a holder for the input end of the optical fiber and a lens system for focusing the laser beams from lasers 30 and 64 to a small spot on the fiber core end to inject the laser beam into the optical fiber. Input coupler 34 may be similar to couplers disclosed in commonly assigned U.S. Pat. Nos. 4,564,736, 4,676,586, and 4,681,396, the disclosures of which are incorporated by reference herein. These patents teach rather simple couplers which enable a laser beam to be injected efficiently and easily into an optical fiber for transmission through the fiber, and these couplers are particularly suitable for use in the present invention.

The tip 68 of the fiber core at the output end 36 of the optical fiber may be polished flat and the output end may be disposed in a lensless coupler or holder such as disclosed, for example, in commonly assigned U.S. application Ser. No. 136,071, filed Dec. 21, 1987, the disclosure of which is also incorporated by reference herein. This output coupler affords a slender holder for the fiber which is easily held and manipulated, and is well suited for either a manual or automatic positioning device or as a hand-held tool.

A debridging process may be performed in the following manner. First, a printed wire board 22 or the like having a microelectronic circuit thereon may be inspected using a viewing system, such as a camera 60 and CRT display 62, which presents a magnified image of the board. This facilitates detection of an undesired solder bridge 12 and enables its location to be pinpointed. The HeNe laser 64 may be energized to couple its visible beam into optical fiber 32 for transmission through the fiber to the printed wire board and soldered leads of the microelectronic circuit. The laser beam emitted from the output end of the optical fiber is projected as a spot onto the board and leads, and enables the optical fiber to be precisely positioned so as to locate the laser beam substantially entirely on solder bridge 12. Wicking tool 50 may then be positioned on the board between the leads and so as to be in contact with the solder bridge, as shown in the figure. The higher power Nd:YAG laser 30 may then be turned on to inject its output beam into optical fiber 32. Laser 30 may be energized for the time required to melt the solder constituting the solder bridge, or otherwise controlled so as to project the required energy onto the bridge for melting. As the solder melts, it flows and wicks onto tool 50. During the heating process while the laser 30 is energized and the melted solder is flowing, tool 50 may be lifted and removed. This removes the solder which has wicked onto the tool from between the leads and, accordingly, destroys the solder bridge. Any solder that remains upon removing the tool can wick back onto the debridged leads 14 and 16 by surface tension.

In addition to facilitating delivery of the laser energy easily to debridge solder joints, optical fiber 32 is advantageous for the delivery of laser energy in that it helps to avoid damage to the printed wire boards by smoothing out any hot spots which may exist in the laser beam. Also, laser energy may be delivered quite precisely and directly to the solder bridge for melting the solder without effecting the integrity of the solder joints connecting the adjacent leads to their pads. Since the laser heat source is non-contacting, it exerts no force on the solder bridge which could affect the solder joints. Wicking tool 50 is merely placed into contact with the solder bridge so that the melted solder can wick onto the tool, but otherwise does not exert forces on the leads which could affect their soldered joints.

The invention has been employed for successfully removing solder bridges of the order of 2-8 mils wide spanning a gap of 4 mils between adjacent pairs of microelectronic circuit leads. Bridges were melted using a laser power of the order of 5-10 watts delivered by an optical fiber to the bridge. A very thin knife blade was used as a wicking tool. Upon the knife blade being removed during heating, the melted solder which had wicked onto the blade was removed and debridging resulted. The integrity of the soldered leads was not affected by the debridging process.

While a preferred embodiment of the invention has been shown and described, it will be appreciated by those skilled in the art that changes may be made in this embodiment without departing from the principles and spirit of the invention, the scope of which is defined in the appended claims.

What is claimed is:

1. A method of debridging microelectronic solder joints comprising positioning a tool in contact with a bridge of solder which extends between soldered leads of microelectronic circuit; projecting a laser beam onto the solder bridge to heat the solder; controlling the laser beam power to cause melting of the solder and wicking of the solder onto the tool; and removing the tool to remove the solder bridge between the leads.

2. The method of claim 1, wherein said controlling comprises controlling the laser beam power to avoid vaporization of the solder bridge.

3. The method of claim 1, wherein said controlling comprises controlling the power applied to the solder bridge to that necessary to produce sufficient melting of the solder to enable the solder to flow onto the tool.

4. The method of claim 3, wherein said controlling comprises limiting the power applied to the solder bridge by controlling the power in the laser beam and the time during which the laser beam is projected onto the solder bridge.

5. The method of claim 1, wherein said projecting comprises injecting the laser beam into an input end of an optical fiber, and positioning an output end of the optical fiber adjacent to the solder bridge such that the beam emitted from the output end is projected onto the solder bridge.

6. The method of claim 5, wherein said projecting comprises supporting the output end of the optical fiber in a lensless coupler so that the laser beam emitted from the output end diverges.

7. The method of claim 5, wherein said positioning comprises injecting another low power laser beam into the optical fiber and positioning the output end of the optical fiber such that the low power laser beam emitted therefrom is projected onto the solder bridge, and thereafter injecting said first-mentioned laser beam into the optical fiber with a higher power in order to melt the solder.

8. The method of claim 5 further comprising viewing the solder bridge and a surrounding area using a viewing system which provides an enlarged image.

9. The method of claim 8, wherein said viewing system comprises a camera and a display device, and wherein said viewing comprises causing a magnified image to be displayed on said display device.

10. The method of claim 5, wherein said positioning of the tool and positioning of the output end of the optical fiber is accomplished with an automatic positioning system.

11. Apparatus for debridging microelectronic solder joints comprising a tool; means for positioning the tool in contact with a bridge of solder which extends between microelectronic leads; means for projecting a laser beam onto the solder bridge to cause melting of the solder and wicking of the melted solder onto the tool; and means for removing the tool during said melting to remove the solder bridge from between said leads.

12. The apparatus of claim 11 wherein said projecting means comprises an optical fiber; means for injecting the laser beam into an input end of the optical fiber; and another positioning means for positioning an output end of the optical fiber adjacent to the solder bridge such that the laser beam emitted from said output end is projected into the solder bridge.

13. The apparatus of claim 12 wherein the output end of the optical fiber is disposed within a lensless coupler so that the beam emitted from the output end of the optical fiber diverges.

14. The apparatus of claim 12 further comprising another means for injecting another low power laser beam into the input end of the optical fiber, and wherein said other positioning means for the output end of the optical fiber includes means responsive to the low power laser beam emitted from the output end for positioning the output end such that the laser beam is projected substantially only onto the solder bridge.

15. The apparatus of claim 14 wherein said low power laser beam is in the visible spectrum.

16. The apparatus of claim 11, wherein said projecting means comprises means for controlling the power applied to the solder bridge so as to cause melting of the solder without vaporization.

17. The apparatus of claim 11 further comprising a viewing system having means for displaying an enlarged image of the solder bridge and a surrounding area.

18. The apparatus of claim 17, wherein the viewing system comprises a camera and a display device.

19. The apparatus of claim 11, wherein said leads are of the order of 4 mils wide and have a spacing of the order of 4 mils.

20. The apparatus of claim 19, wherein said tool comprises a metallic member having a dimension less than the spacing between the leads.

* * * * *